United States Patent
Wang et al.

(10) Patent No.: US 11,675,726 B2
(45) Date of Patent: Jun. 13, 2023

(54) INTERCONNECT REPEATER PLANNING AND IMPLEMENTATION FLOW FOR ABUTTING DESIGNS

(71) Applicant: Synopsys, Inc., Mountain View, CA (US)

(72) Inventors: Kai-Ping Wang, Sunnyvale, CA (US); Songmei Chen, Shanghai (CN); Ying Liu, Shanghai (CN); Xiaolin Yuan, Shanghai (CN)

(73) Assignee: Synopsys, Inc, Mountain View, CA (US)

( * ) Notice: Subject to any disclaimer, the term of this patent is extended or adjusted under 35 U.S.C. 154(b) by 43 days.

(21) Appl. No.: 17/315,211

(22) Filed: May 7, 2021

(65) Prior Publication Data

US 2021/0349845 A1 Nov. 11, 2021

(30) Foreign Application Priority Data

May 7, 2020 (WO) ................ PCT/CN2020/088985

(51) Int. Cl.
*G06F 13/40* (2006.01)
*G06F 30/327* (2020.01)
*G06F 30/33* (2020.01)

(52) U.S. Cl.
CPC ...... *G06F 13/4068* (2013.01); *G06F 13/4059* (2013.01); *G06F 13/4095* (2013.01); *G06F 30/327* (2020.01); *G06F 30/33* (2020.01)

(58) Field of Classification Search
CPC ........ G06F 13/04; G06F 30/327; G06F 30/33; G06F 13/4068; G06F 13/4095; G06F 13/4059
See application file for complete search history.

(56) References Cited

U.S. PATENT DOCUMENTS

| | | | |
|---|---|---|---|
| 7,418,686 B1* | 8/2008 | Knol | G06F 30/392 716/118 |
| 8,954,915 B2* | 2/2015 | Chan | G06F 30/392 716/135 |
| 9,262,359 B1 | 2/2016 | Noice et al. | |
| 9,262,570 B2* | 2/2016 | Hsu | G06F 30/392 |
| 10,297,596 B2* | 5/2019 | Sharma | H01L 27/0886 |
| 2013/0219353 A1* | 8/2013 | Henrickson | G06F 30/394 716/122 |
| 2021/0165856 A1* | 6/2021 | Kazda | G06F 30/398 |
| 2021/0192115 A1* | 6/2021 | Babokhov | G06F 30/394 |

* cited by examiner

*Primary Examiner* — Henry Tsai
*Assistant Examiner* — Christopher A Daley
(74) *Attorney, Agent, or Firm* — Lowenstein Sandler LLP

(57) ABSTRACT

A method including creating a first bus guide and a second bus guide of a plurality of bus guides for an integrated circuit is disclosed. The method includes routing the first bus guide and the second bus guide through a plurality of layout blocks of the integrated circuit. The method includes annotating the first bus guide or the second bus guide to identify a plurality of areas for placing a plurality of repeaters within the first bus guide or the second bus guide. The method includes, based on the annotated first bus guide and the second bus guide, generating, by at least one processor, a plurality of guidance directories corresponding to a plurality of routes through the plurality of layout blocks for placing the plurality of repeaters at the plurality of layout blocks on the identified plurality of areas on the first bus guide or the second bus guide.

20 Claims, 12 Drawing Sheets

INTERCONNECT REPEATER PLANNING AND IMPLEMENTATION FLOW FOR ABUTTING DESIGNS

RELATED APPLICATIONS

The present application claims priority under 35 U.S.C. § 119(a) to Patent Cooperation Treaty (PCT) Application No. PCT/CN2020/088985 filed with the Chinese National Intellectual Property Administration (CNIPA) on May 7, 2020, which is incorporated herein by reference in its entirety for all purposes.

FIELD(S) OF TECHNOLOGY

This disclosure relates to the field of electronic design automation in general, including the following topics: The present disclosure relates to repeater planning in general, and more specifically, repeater planning for global interconnect for abutted designs.

BACKGROUND

With the advance of technology, repeater planning for global interconnect is becoming a critical step in the overall design flow. For abutted designs, when the number of interconnect used to be small and a user can manage the repeater planning manually. An integrated circuit (IC) designer may take a bottom-up or top-down approach while planning the interconnect repeater manually. During the bottom-up or top-down approach, the IC designer needs to transform the planning from the top level to sub-blocks, or vice versa, which includes both physical and logical changes, and they must be consistent. Taking the top-down approach as an example, the designer needs to create interconnect routes over blocks, plan repeaters on the routes at the top level, and then push down the routes and repeaters to blocks. During pushdown, the IC designer needs to create feedthrough ports on the blocks where the routes go through and place them along the routes. The IC designer also needs to place repeaters correctly in the blocks. Based on the placement of the created feedthrough ports, a top-level netlist needs to be updated accordingly. The design process requires many iterations of creating interconnect routes over blocks, planning repeaters on the routes, and updating top-level netlist. The entire design process is, therefore, very expensive in terms of time and resources.

SUMMARY

In one embodiment, a computer-implemented method for placing and routing is disclosed. The method includes creating a first bus guide of a plurality of bus guides and a second bus guide of the plurality of bus guides for an integrated circuit. The first bus guide may correspond to a first plurality of bit nets, and the second bus guide may correspond to a second plurality of bit nets. The method includes routing the first bus guide and the second bus guide through a plurality of blocks of the integrated circuit. The method includes annotating the first bus guide or the second bus guide to identify a plurality of areas for placing a plurality of repeaters within the first bus guide or the second bus guide. The method includes, based on the annotated first bus guide and the second bus guide, generating, by at least one processor, a plurality of guidance directories corresponding to a plurality of routes through the plurality of blocks. Each guidance directory or the plurality of guidance directories may be associated with a block of the plurality of blocks. The method includes placing the plurality of repeaters at the plurality of blocks on the identified plurality of areas on the first bus guide or the second bus guide based on the generated plurality of guidance directories.

In another embodiment, a system for placing and routing is disclosed. The system includes a memory configured to store operations and one or more processors configured to perform the operations, including creating a first bus guide of a plurality of bus guides and a second bus guide of the plurality of bus guides for an integrated circuit. The first bus guide may correspond to a first plurality of bit nets, and the second bus guide may correspond to a second plurality of bit nets. The operations include routing the first bus guide and the second bus guide through a plurality of blocks of the integrated circuit. The operations include annotating the first bus guide or the second bus guide to identify a plurality of areas for placing a plurality of repeaters within the first bus guide or the second bus guide. The operations include, based on the annotated first bus guide and the second bus guide, generating, by at least one processor, a plurality of guidance directories corresponding to a plurality of routes through the plurality of blocks. Each guidance directory or the plurality of guidance directories may be associated with a block of the plurality of blocks. The operations include placing the plurality of repeaters at the plurality of blocks on the identified plurality of areas on the first bus guide or the second bus guide based on the generated plurality of guidance directories.

In yet another embodiment, a non-transitory, tangible computer-readable device having instructions stored thereon is disclosed. The instructions when executed by at least one computing device, cause the at least one computing device to perform operations for placing and routing. The operations include creating a first bus guide of a plurality of bus guides and a second bus guide of the plurality of bus guides for an integrated circuit. The first bus guide may correspond to a first plurality of bit nets, and the second bus guide may correspond to a second plurality of bit nets. The operations include routing the first bus guide and the second bus guide through a plurality of blocks of the integrated circuit. The operations include annotating the first bus guide or the second bus guide to identify a plurality of areas for placing a plurality of repeaters within the first bus guide or the second bus guide. The operations include, based on the annotated first bus guide and the second bus guide, generating, by at least one processor, a plurality of guidance directories corresponding to a plurality of routes through the plurality of blocks. Each guidance directory or the plurality of guidance directories may be associated with a block of the plurality of blocks. The operations include placing the plurality of repeaters at the plurality of blocks on the identified plurality of areas on the first bus guide or the second bus guide based on the generated plurality of guidance directories.

DRAWINGS

DETAILED DESCRIPTION

Figure 1:
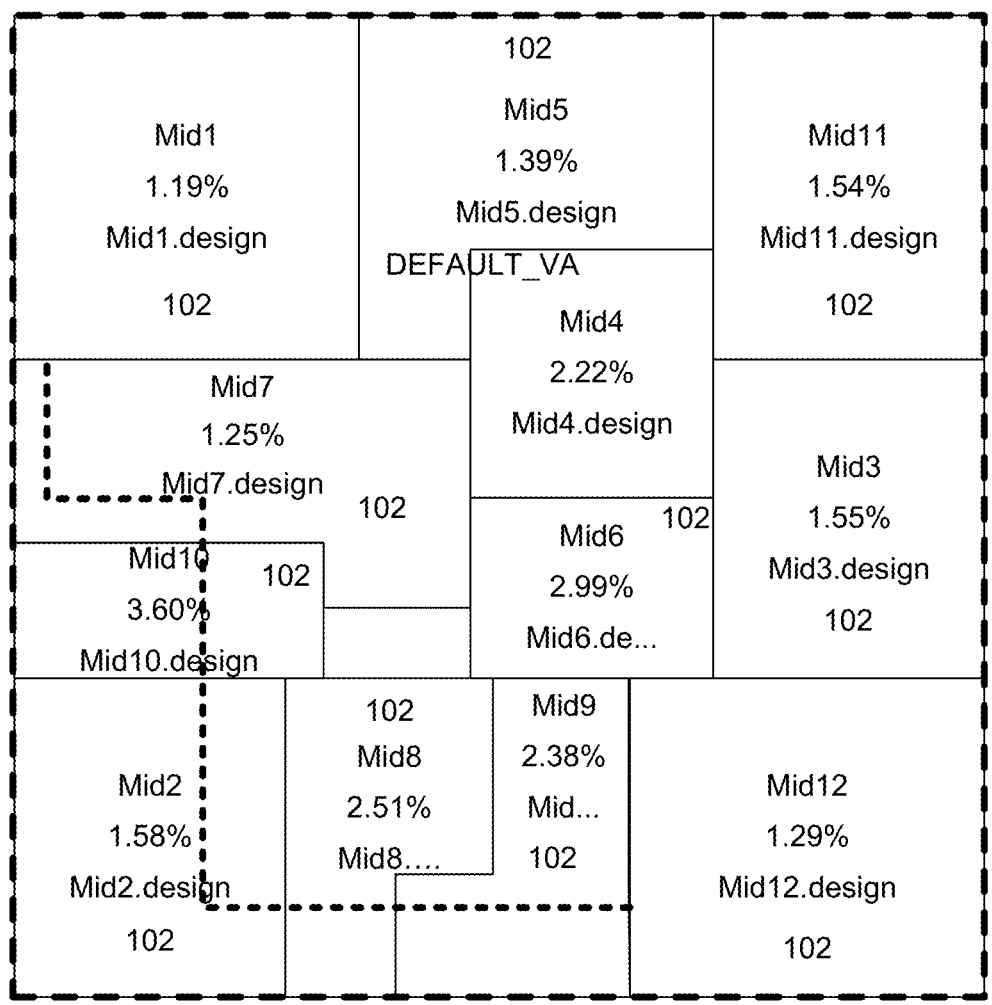
FIG. 1 illustrates global interconnect repeater planning for abutting designs.

With the increasing number of global interconnects, it has become a challenge to do the repeater planning for global interconnect manually. Further, because of repeater planning for buffers/inverters and retimer flops is different, cross-team synchronization for the planning strategy and implementation process of retimer flops and buffers/inverters for place and route (PnR) top-level planning, register-transfer level (RTL) designing, and block-level designing, etc. may be required. Cross-team synchronization is expensive and error-prone. Accordingly, it is inefficient to perform these tasks manually. In the present disclosure, a new solution approach in an electronic design and automation (EDA) tool is described.

In some embodiments, a top-down automatic repeater planning flow facilitates interconnect repeater planning and implementation on abutting designs. The disclosed top-down automatic repeater planning flow may simplify and improve the repeater planning flow for top-level planning, RTL changes, and block implementation. Further, the time required for planning and implementation for the repeater for global interconnect may be shortened. With the present smart guidance directory generated for one or more blocks of a plurality of blocks, the manual efforts and learning curve for the IC designer may be minimized. Additionally, the disclosed automatic repeater planning flow is also scalable since the major steps in planning and implementation are automated.

An example embodiment of a top-level repeater-planning flow for abutting designs may use innovative ideas of annotated repeaters with bus guides (e.g., physical bus guides as implemented in a hardware IC design). There may be multiple buses at the top level. Problems may be more severe when buses number in the hundreds or thousands.

For a given bus, bus guides may be created to represent paths for routing the buses. Any bus may have a corresponding bus guide. Bus guides may have multiple bus-guide shapes (segments), which may span multiple blocks in the same layer of an IC and/or which may span different layers of the IC. Within the same layer, bus-guide shapes, corresponding to different bus guides, may not overlap each other.

Once the bus-routing paths are created, annotated repeaters may be added: Annotated repeaters may be inserted following the path bus guide. The annotated repeaters for re-timer flop arrays may be inserted first. The annotated repeaters may represent locations and areas for re-timer flop arrays, buffers, and/or inverters, for example. As a second step, annotated repeaters for buffer or inverter arrays may be inserted between two re-timer annotated repeaters. The annotated repeaters may represent locations and areas for buffer or inverter arrays. Following top-level planning, the plan may be pushed down to lower-level blocks: For each block, feedthrough pins and nets may be created. The bus guides and annotated repeaters may be cloned to the block, in some embodiments.

To derive implementation guidance A directory may be created and stored, e.g., in a computer memory and/or in a logical data structure, such as a database or filesystem, and may be associated to the design to encapsulate the guidance of the design. Under that directory, sub-directories, associated with each block, may be created to hold the guidance for that block.

There may be multiple sets of Tcl guidance files, e.g., for RTL designers, guidance may be configured to update a top-level netlist, to create feedthrough ports and/or feedthrough buses, to enumerate and/or quantify physical characteristics of re-timer flop arrays, buffers, etc., may be created. Based on the annotated repeaters, e.g., for re-tinier flop, buffers, or the like, may be placed on the bus guide, according to some embodiments.

For block designers, guidance may be configured to assign locations of feedthrough ports, for example. Additionally, or alternatively, guidance may be generated for creating bus guides, including guidance for placing (inserting) repeaters along the bus guides, e.g., re-timer flops, buffers, inverters, buffer arrays, inverter arrays, etc., based at least in part on the annotated repeaters for buffer arrays, according to some embodiments. A bus guide may be removed after repeaters are placed or inserted.

As another example of implementation, RTL designers may source guidance scripts (e.g., Tcl scripts or other code) to update an RTL netlist. Block designers may source guidance scripts to implement the repeater placement (e.g., re-timer flop array placement, buffer (or inverter) array insertion, etc.).

In some embodiments, the automatic repeater planning flow may include two parts: (1) top-level planning with bus guides and annotated repeaters; and (2) auto derive smart guidance for block implementation.

Top-Level Planning with Bus Guides and Annotated Repeaters

In some embodiments, a bus guide, which is a representation of a plurality of nets in a bus with a plurality of routes having the same width and/or height as a buffer array size, may be created. A user may specify the desired buffer array size, i.e., the width and/or the height. The bus guide may help to address the following problem in the IC design. The buffer array is described below.

Bus buffering is a classic problem for floor planning in IC design. Floorplanning is to arrange interconnected blocks of a plurality of sub-designs in a way such that they can be fitted into a chip and satisfy the design requirements. A bus is a group of interconnects connecting a plurality of blocks. Data can be sent from one block to another through the buses.

During the floor planning phase, the bus needs to be routed through a channel, which is space between blocks, with metal wires. It is required that the data on the same bus is transferred at high speed and arrive at the targeted connecting point at the same time. The buffers are used to speed up the data transmissions on the bus. Since the available channel space is not known and a netlist often needs to be updated during the floor planning phase, the bus buffering tasks requires many iterations between a physical designer and route-transfer-logic (RTL) designers.

In a typical flow of bus buffering, the IC designer often creates the routes for each bus-bit net first and then places the buffer array, i.e., an array of buffers, at the desired locations. In this process, the routes often may use different overlapping layers of an IC. This approach makes it difficult to find a placement location to place a buffer in the buffer array on overlapping buses. When many buses are routed in the same channels, there may also be sufficient routing resources with multi-layer routing. However, the buffers cannot be placed on top of each other. The buffering resources in the channel may require more than considering routing alone. When the number of buses becomes large, the routing for the nets of buses may interact with each other, which makes routing runtime and complex. In some embodiments, a long bus may be divided into multiple buses due to timing consideration, which needs to be reconstructed later.

Solving the above-mentioned problems manually for the number of buses, for example, less than 100, may take substantial time and resources. Accordingly, when the number of buses grows large, for example, more than 200, traditional manual approaches may not be sufficient to solve the above-noted problems.

Reserve the Routing Resource for Buses

In accordance with some embodiments, a bus guide may be created with the same width as the buffer array size, and the buffer arrays may be inserted wherever the bus guide can run through. When multiple bus guides are going through the same area on the same layer of an IC without the bus guides overlapping, buffer arrays for a different bus guide may therefore avoid interfering with each other.

Channel Resource Planning for Bus Buffering

In accordance with some embodiments, the bus guide may be used to analyze the channel resource for placing multiple buffer arrays for different buses in the same channel.

Reduce the Time and Complexity of Bus Routing and Buffering

In accordance with some embodiments, a bus guide is a representation of all nets in a bus. To create the bus guide, a net routing, e.g., for as few as one net corresponding to the bus guide may be needed. The bus guide, therefore, may reduce the need to process each net in the bus when inserting (placing) the buffer arrays at the target locations. As a result, the time and complexity incurred by the bus routing and buffering (repeater placing) may be reduced.

Virtual Connection Concept

In accordance with some embodiments, similar to the bus guide, which is a representation of nets, a virtual bus connection to connect sets of pins without real bus nets may be created. This virtual connection may be used for planning buffer arrays across multiple bus connections.

Reserve the Routing Resource for Buses

One route path may represent one bit net, and therefore many different route paths may be used for each bus having multiple bit nets. However, because a single bus guide may correspond to any or all bit nets for a given bus, irrespective of the number of bit nets in the bus, the given bus may therefore use a single bus guide.

In accordance with some embodiments, the bus guide may be created with the same width as the buffer array size, so the buffer arrays can be inserted wherever the bus guide can run through. When multiple bus guides are going through the same area without overlapping, buffer arrays different bus guides may not interfere with each other.

In accordance with some embodiments, the bus guide may be used to analyze the channel resource for placing multiple buffer arrays for different buses in the same channel.

In accordance with some embodiments, the bus guides may include entire buffer arrays inside, which may help the user to handle the interaction of buffer arrays between multiple buses, which may be close or may have intersecting points. As a result, the buffer arrays may be placed without overlapping over each other or other conflicts.

In accordance with some embodiments, an annotated repeater may represent a set of repeaters, for example, an inverter, a buffer, or a retimer flop, to be placed in an array pattern. The location of the annotated repeater is the location of a repeater array. The area of an annotated repeater may be the area needed by the repeater arrays. After creating the bus guide over abutting blocks, the top-level repeater planning designer or specialized tool for bus-guide adjustment may adjust the bus guide for better planning and/or quality of results (QoR), if needed. After the bus guide adjustment, annotated repeaters may be added onto bus guides in accordance with the distance constraints or location constraints, for example.

Auto-Derive Smart Guidance for Block Implementation

In accordance with some embodiments, based at least in part on the top-level planning results, a block-level plan may be created. In the process of creating the block-level plan, feedthrough ports, feedthrough nets, bus guides, and/or annotated repeaters may be created in one or more layout blocks. The smart guidance may automatically derive instructions specifying how to update the design for RTL designers and block implementation designers. The instructions may be derived in accordance with distance rules or other rules depending on a layout of multiple bus guides and/or layout blocks and corresponding feedthrough ports/nets or repeaters, based on new objects created in a layout block (e.g., feedthrough ports/nets, repeaters, bus guides, etc., and written to a computer memory or data storage, for example. To generate these instructions as design change guidance, one or more guidance directories may be accessed or created to hold the smart guidance in the computer memory or data storage, according to some embodiments.

The derived smart guidance may be used to create feedthrough nets and implement repeater insertion at the RTL level and block level. With the smart guidance generated from top-level planning, the RTL and block-level implementation may be automated using the guidance to create the feedthrough nets and associated retimer flops for block implementation. Block-level designers may source the implementation guidance to add the repeater array without needing to learn implementation details.

In the following, the above embodiments are described using figures.

Top-Level Planning with Bus Guides and Annotated Repeaters

FIG. 1 illustrates global interconnect repeater planning for abutting designs. As shown in FIG. 1, there may be a plurality of abutting blocks 102. Top-level planning is performed by a place-and-route (PnR) top-level planner. In accordance with some embodiments, the top-level planning may include steps to create a plurality of bus guides; and to add annotated repeaters onto the plurality of bus guides.

Create Bus Guides

In some embodiments, a single bus guide may be used to represent all nets in one or more buses. Based on the bus width (number of bits), buffer array pattern, and buffer array size, a routing engine may create the bus guide, which may have the same width as the buffer array size, i.e., a width and/or a height, and may cross over abutting blocks.

Figure 2:
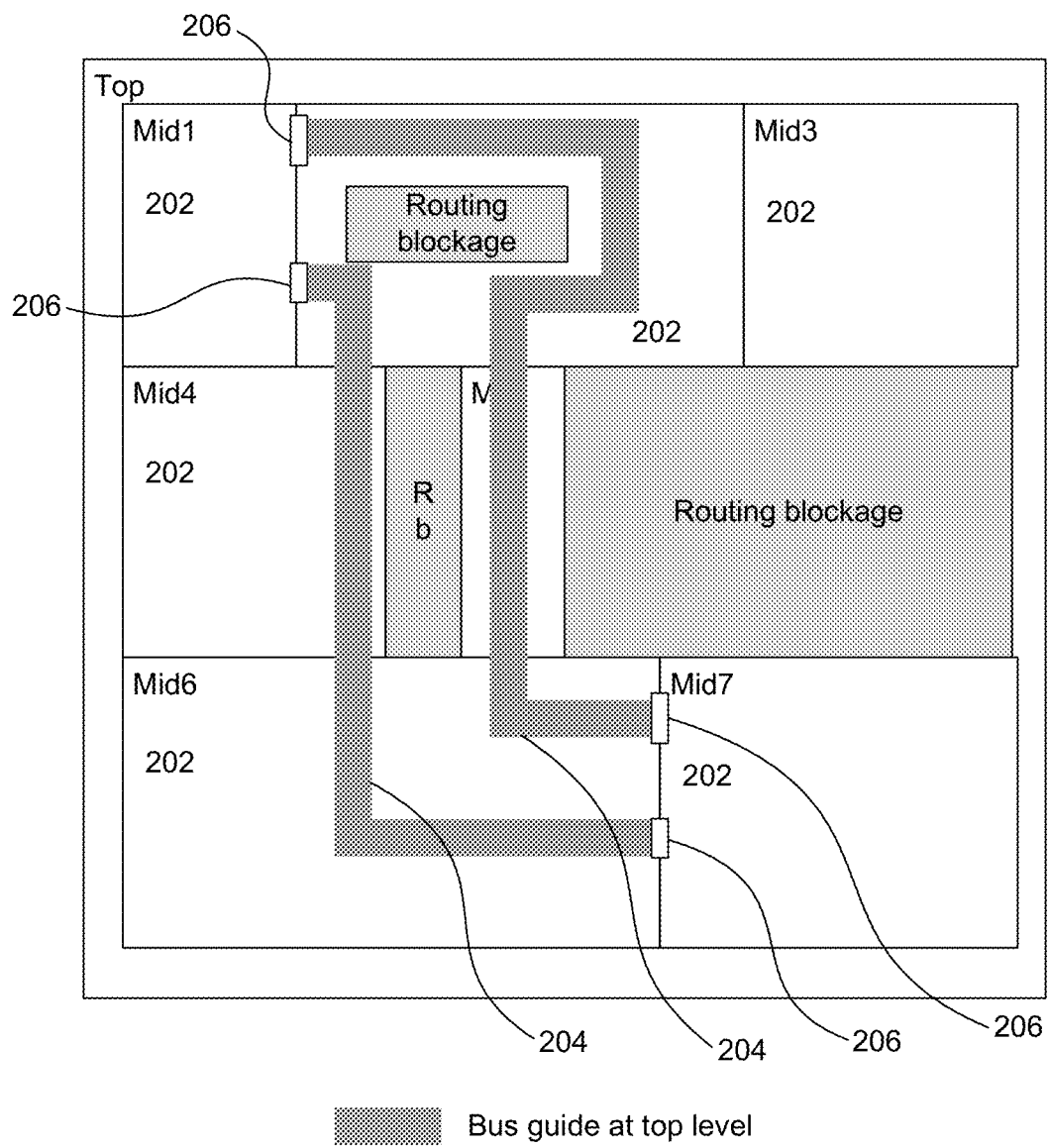
FIG. 2 illustrates bus guides in accordance with some embodiments.

FIG. 2 illustrates the bus guide creation for two buses, in accordance with some embodiments. As shown in FIG. 2, the plurality of abutting blocks 202 are shown, along with, bus guides 204. Each bus guide of the bus guides 204, may represent a plurality of bit nets of one or more buses. Further, as shown in FIG. 2, the bus guides may be routed through an area identified as non-blocking, i.e., open for routing. Some of the areas of the blocks 202 may be marked as blocking, as those areas may be reserved for other purposes, etc. Accordingly, the bus guides 204 may be created and routed in accordance with the specifications given by the user. In addition to the bus guides 204, feedthrough nets/ports 206 may also be created. The feedthrough ports 206 may represent one or more input and/or output connection or pin for one or more bit nets of the bus guide. In some embodiments, by way of a non-limiting example, the bus guides may be in different layers. However, the bus guides in different layers are routed in such a way that they may not overlap over each other so that buffer arrays may be placed (inserted) on the bus guides in different layers.

In accordance with some embodiments, the buffer array may be a predefined buffer bank, such as an array of buffers. After creating bus guides over abutting blocks, a top-level planner may adjust one or more bus guides for better planning and/or QoR, if needed. By way of a non-limiting example, one or more bus guides may be adjusted to fix a design rule checking (DRC) violation.

Add Annotated Repeaters

Figure 3:
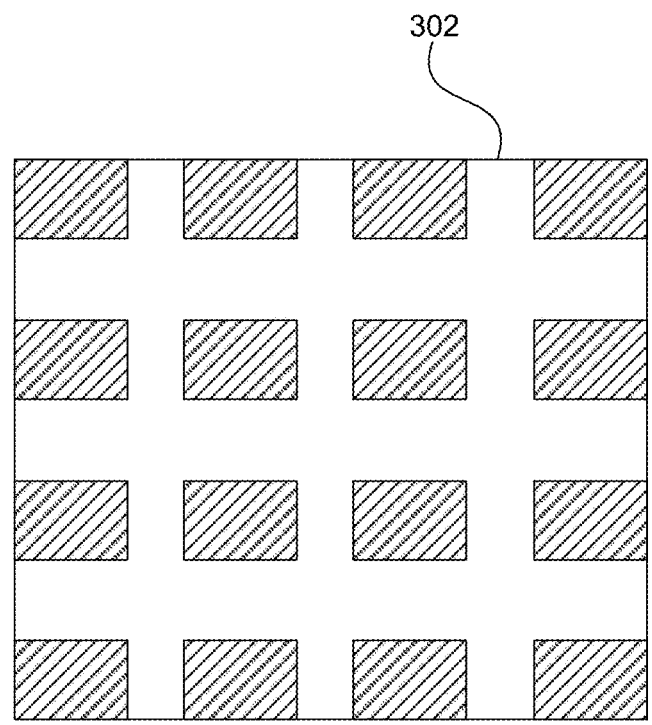
FIG. 3 illustrates a buffer array in accordance with some embodiments.

In some embodiments, an annotated repeater may represent a set of repeaters inverter, buffer, and/or retimer flop, to be placed on the bus guide as an array pattern. FIG. 3 illustrates a buffer array in accordance with some embodiments. As shown in FIG. 3, repeaters may be placed (inserted) in an array pattern 302 on the bus guide. The array pattern 302 may be repeated on the bus guide, and designated areas may be used for placing the inverter, the buffer, and/or the retimer flop. While the inverter, the buffer, and/or the retimer flop are mentioned in this disclosure, the designated areas may be used for placing another types of components as well.

As stated above, the location of the annotated repeater may be the location of a repeater array. The area of an annotated repeater may be the area needed by the repeater arrays. By way of non-limiting example, the annotated repeaters may be of two types: a retimer flop and a buffer array.

Figure 4:
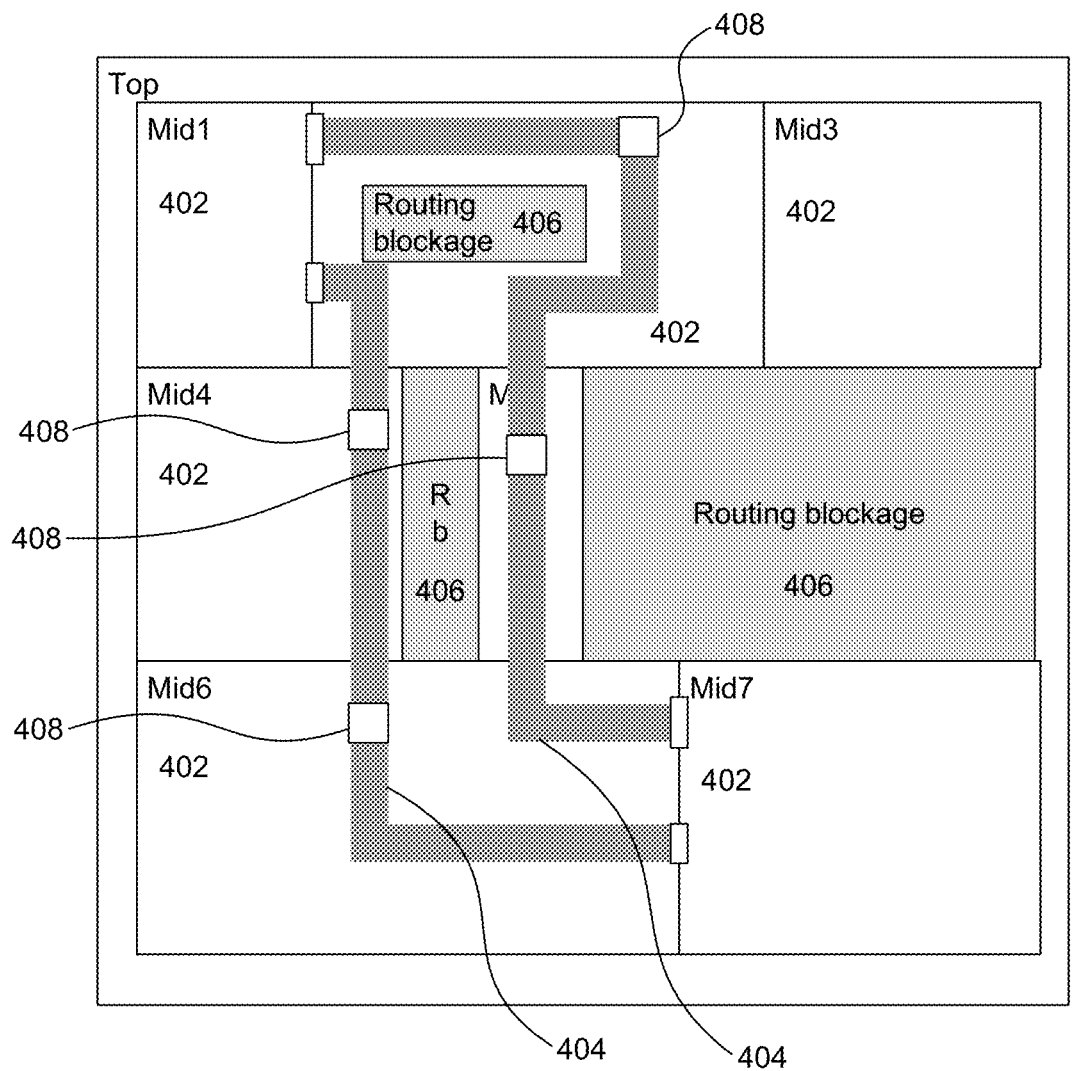
FIG. 4 illustrates annotated repeaters of one type, in accordance with some embodiments.

FIG. 4 illustrates one type of annotated repeaters, in accordance with some embodiments. As shown in FIG. 4, a plurality of abutting blocks 402, and bus guides 404 are shown. Further, as shown in FIG. 4, areas 406 are marked as routing blockage. In other words, bus guides 404 may not be routed through the areas 406. On the bus guides 404, areas 408 may be annotated as locations for placing the repeaters. By way of a non-limiting example, the areas 408 may be used for inserting the retimer flops.

Figure 5:
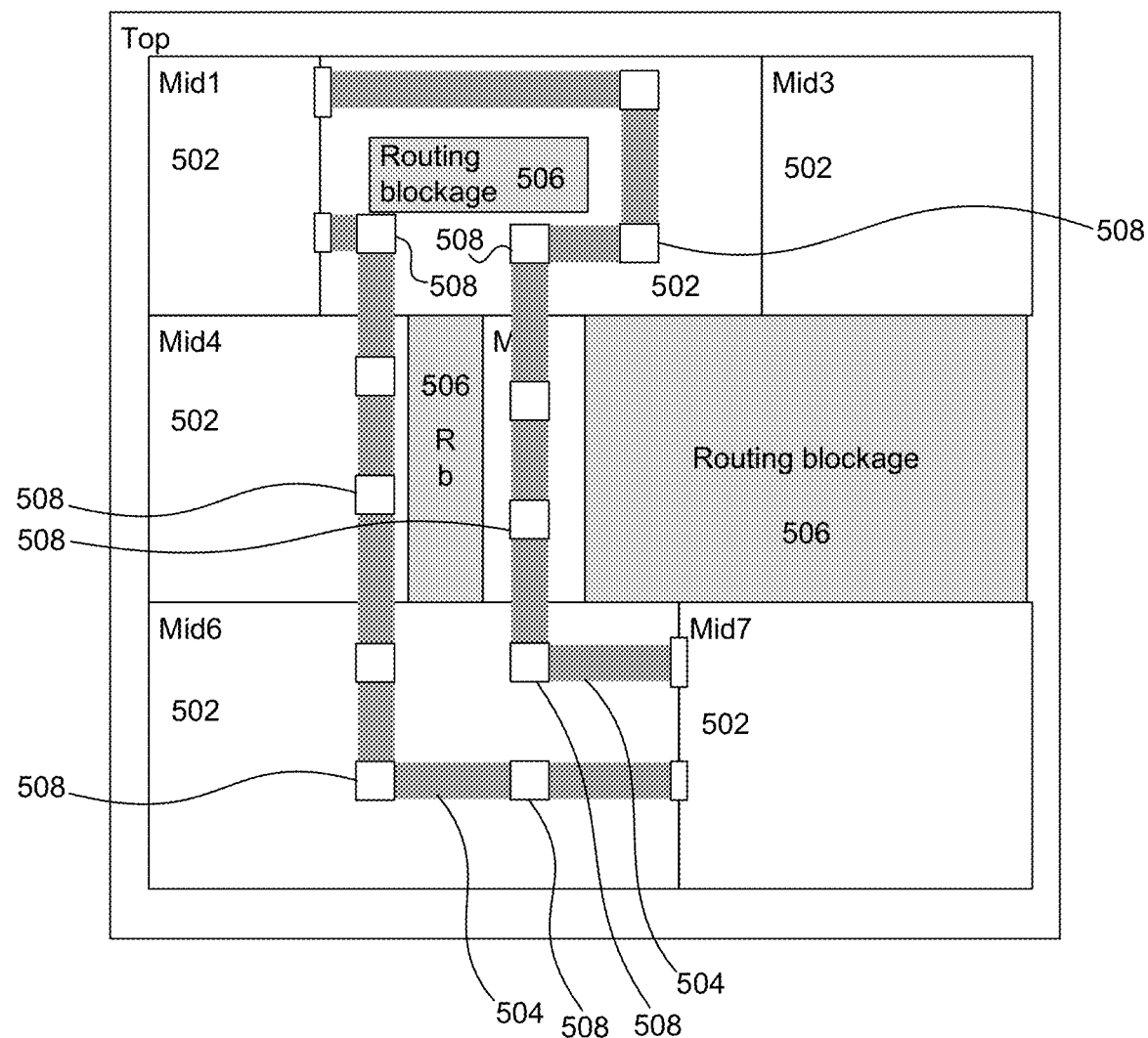
FIG. 5 illustrates annotated repeaters of another type, in accordance with some embodiments.

FIG. 5 illustrates another type of annotated repeaters, in accordance with some embodiments. As shown in FIG. 5, a plurality of abutting blocks 502, and bus guides 504 are shown. Further, as shown in FIG. 5, areas 506 are marked as routing blockage. In other words, bus guides 504 may not be routed through the areas 506. On the bus guides 504, areas 508 may be annotated as locations for inserting the repeaters. By way of a non-limiting example, the areas 508 may be used for inserting the buffers and/or the inverters. Repeaters, such as buffers, inverters, flip-flops (retime flops), etc., may be placed in accordance with distance rules that may inform or determine where on bus guides 504 the areas 508 may be located, for example. Some uses cases of IC design planning using EDA tools may allow for simultaneous placement of repeaters of same or different types, e.g., retimer flops and buffers along at least one bus guide.

In accordance with some embodiments, and as described above using FIG. 4 and/or FIG. 5, after bus guide adjustment, i.e., routing the bus guides to meet the QoR and/or avoiding the DRC violation, the top-level planner may add annotated repeaters onto bus guides based on the distance or location constraints. Annotated repeaters of the retimer flop type, as shown in FIG. 4, may be added first. Annotated repeaters in buffer array type, as shown in FIG. 5, may be added between retimer flop type annotated repeaters. Accordingly, buffer array distance after each retimer flop type annotated repeaters may be reset automatically.

Auto-Derive Smart Guidance for Block Implementation

After top-level planning with bus guides and annotated repeaters, as described above, the top-level planner may derive smart guidance for RTL netlist update and block implementation automatically.

Device Smart Guidance

Based on the top-level planning of the bus guides and annotated repeaters, the smart guidance generator may create the associated objects in corresponding layout block(s). This process may thereby create a block-level plan for each corresponding layout block.

Figure 6:
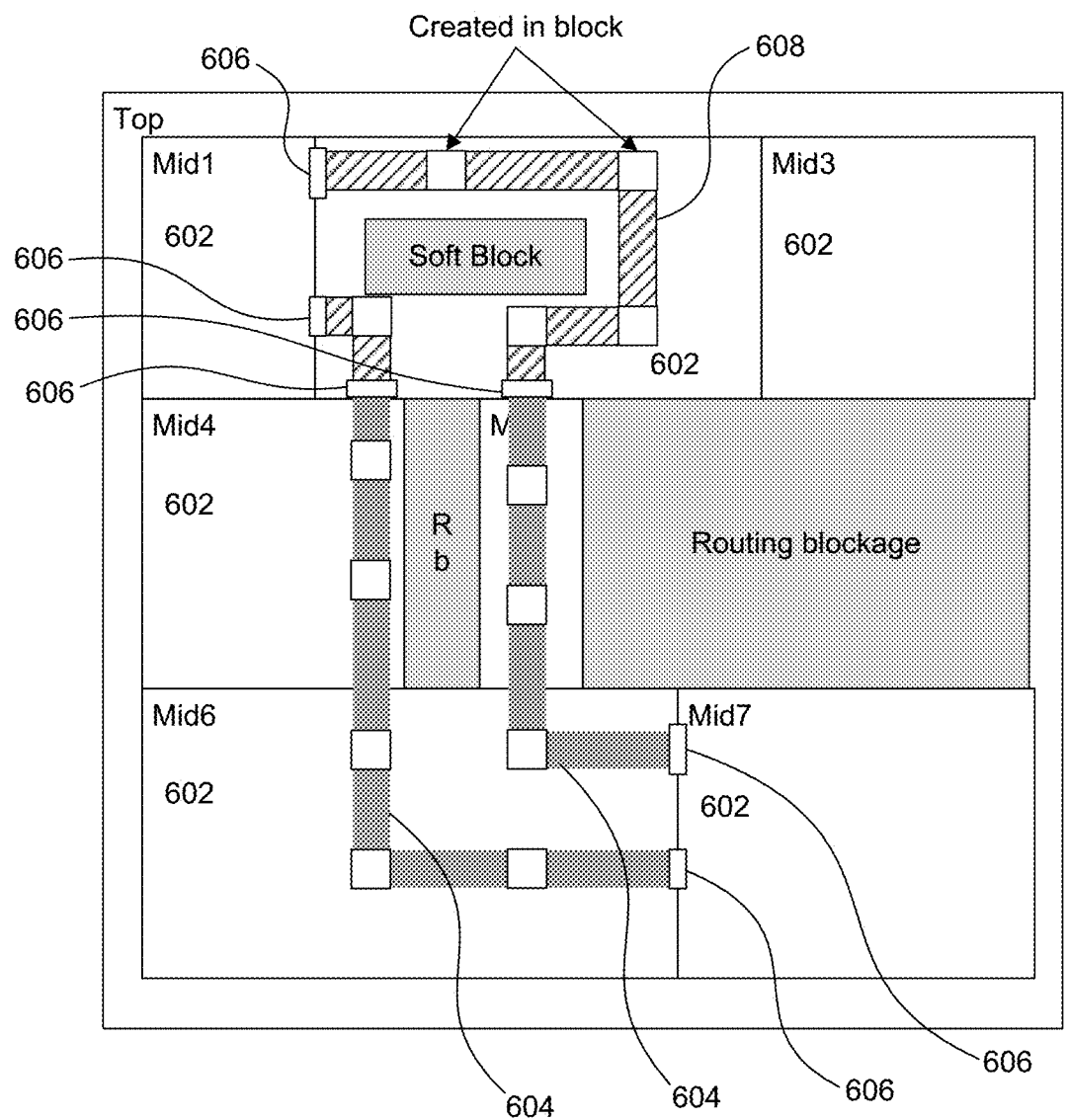
FIG. 6 illustrates derived smart guidance in accordance with some embodiments.

FIG. 6 illustrates a floorplan with PnR for which block level plan is created, in accordance with some embodiments. Blockages may be marked as routing blockages or soft blocks effectively reserving some areas not to have buses routed through them. The block plan created for the abutting blocks 602 the following associated objects, such as (1) feedthrough ports 606 and feedthrough nets or bus guides 604; (2) copy of top-level annotated repeaters of any type, for example, retimer flop and/or buffer array, on the bug guides 604 with annotated placement information; and (3) bus guide segments 608, inside the block and copied from the top-level bus guides.

For RTL guidance, the smart guidance may derive instructions to create feedthrough ports and/or feedthrough nets. The smart guidance may also calculate a number of retimer flops for corresponding feedthrough nets.

For block implementation, the smart guidance may derive instructions to generate feedthrough port locations and bus guides for feedthrough nets. The smart guidance may also derive instructions to place the retimer flops and instructions to add buffer arrays based on the annotated repeaters in the plan. Considering the annotations, the smart guidance allows for improved consistency of results and efficiency of implementing IC-planning operations, reducing overall time between planning and implementation. These instructions derived for the RTL and block implementation may thus be used to implement guidance of design changes for RTL designers and block implementation designers.

Write Smart Guidance

Figure 7:
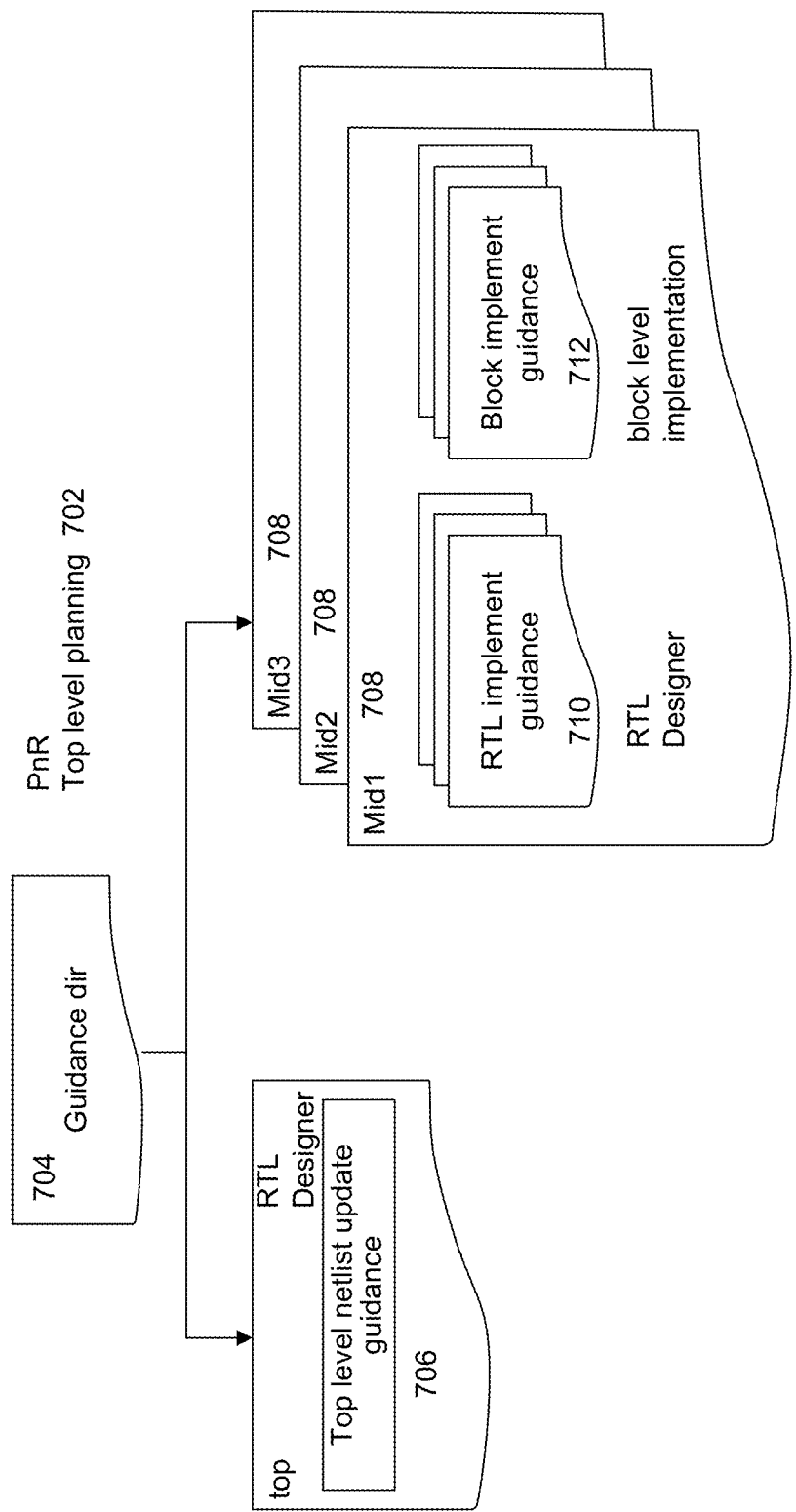
FIG. 7 illustrates a smart guidance directory structure in accordance with some embodiments.

In accordance with some embodiments, the top-level planner, for example, may write out the derived smart guidance 702. By way of a non-limiting example, the smart guidance may be generated as an executable code or script. The executable script may use Tcl/Tk or another scripting language or executable code, which may be compiled or interpreted, for example. The generated scripts may be saved under a specified directory 704. The scripts may be organized as shown in FIG. 7. There may be one file 706 for a top-level netlist update. Each block 708 may have a corresponding subdirectory that contains two types of files; one type of file 710 may be for RTL feedthrough port creations and retimer flop insertion (placement), and the other type of file 712 may be for block-level implementation.

RTL Netlist Update and Implementation

Figure 8:
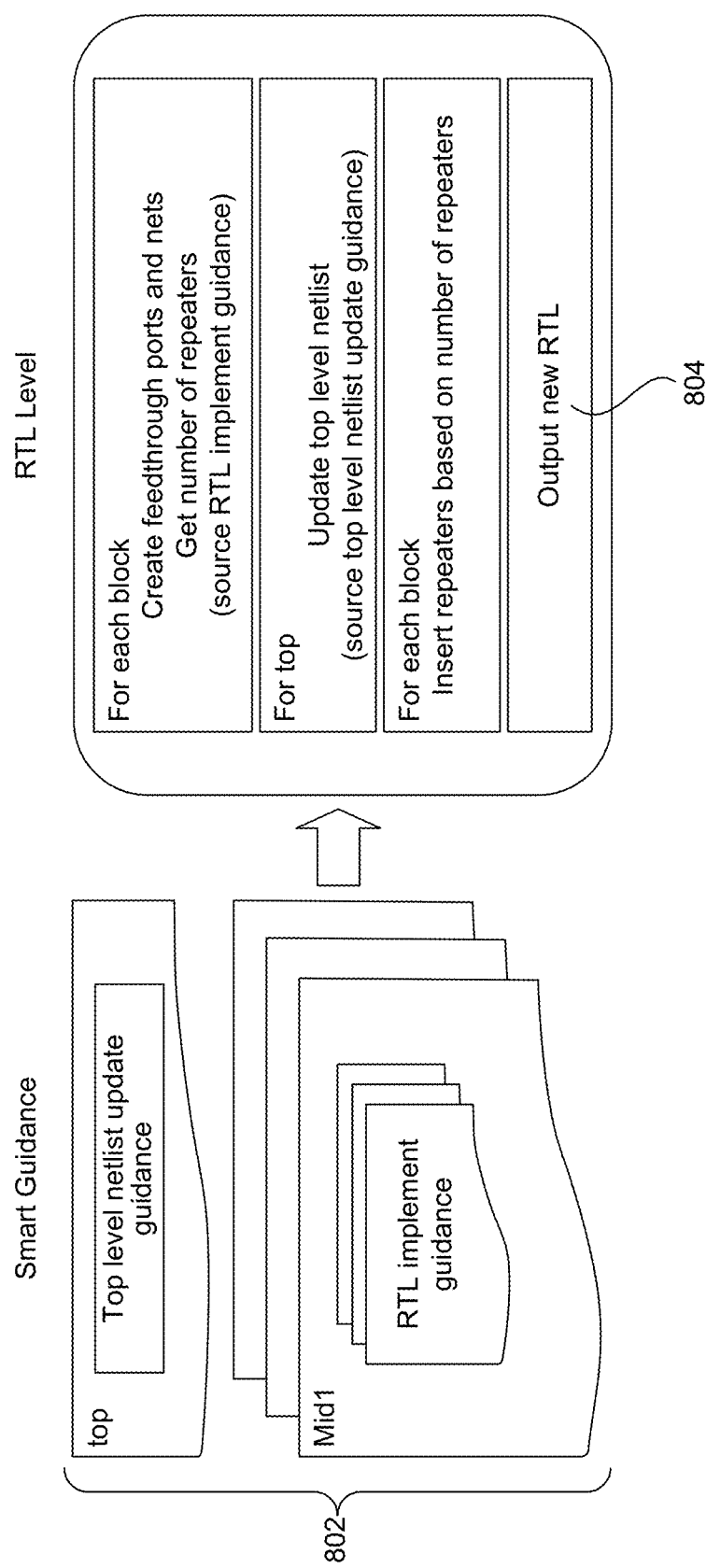
FIG. 8 illustrates a route-transfer-logic (RTL) netlist update and implementation, in accordance with some embodiments.

FIG. 8 illustrates an RTL netlist update and implementation flow, in accordance with some embodiments. As shown in FIG. 8, after the top-level planner generates the smart guidance, the RTL implementation guidance 802 may be sourced to create needed feedthrough ports and bus guides and get a number of retimer flop type annotated repeaters for each block. The top-level netlist update guidance may be sourced to connect feedthrough ports using the bus guides. After that, retimer flops may be placed (inserted) in each block based on the number of retimer flop type of annotated repeaters stated in the RTL implement guidance to generate a new RTL for block-level implementation.

Block Implementation

After the new RTL 804 for each block is generated, the new RTL 804 may be synthesized to source the block implementation guidance to add the repeater array for each block. Accordingly, the smart guidance may help to assign feedthrough port location, locate placement regions based on transformed annotated repeaters of retimer flop type, place retimer flops created by RTL designer in the placement regions into retimer flop array, create bus guides in the block, and add buffer arrays based on the transformed locations of annotated repeaters in the buffer array automatically. By way of a non-limiting example, the buffer arrays may be created according to a user-defined pattern.

Smart Guidance Usage Flow

Figure 9:
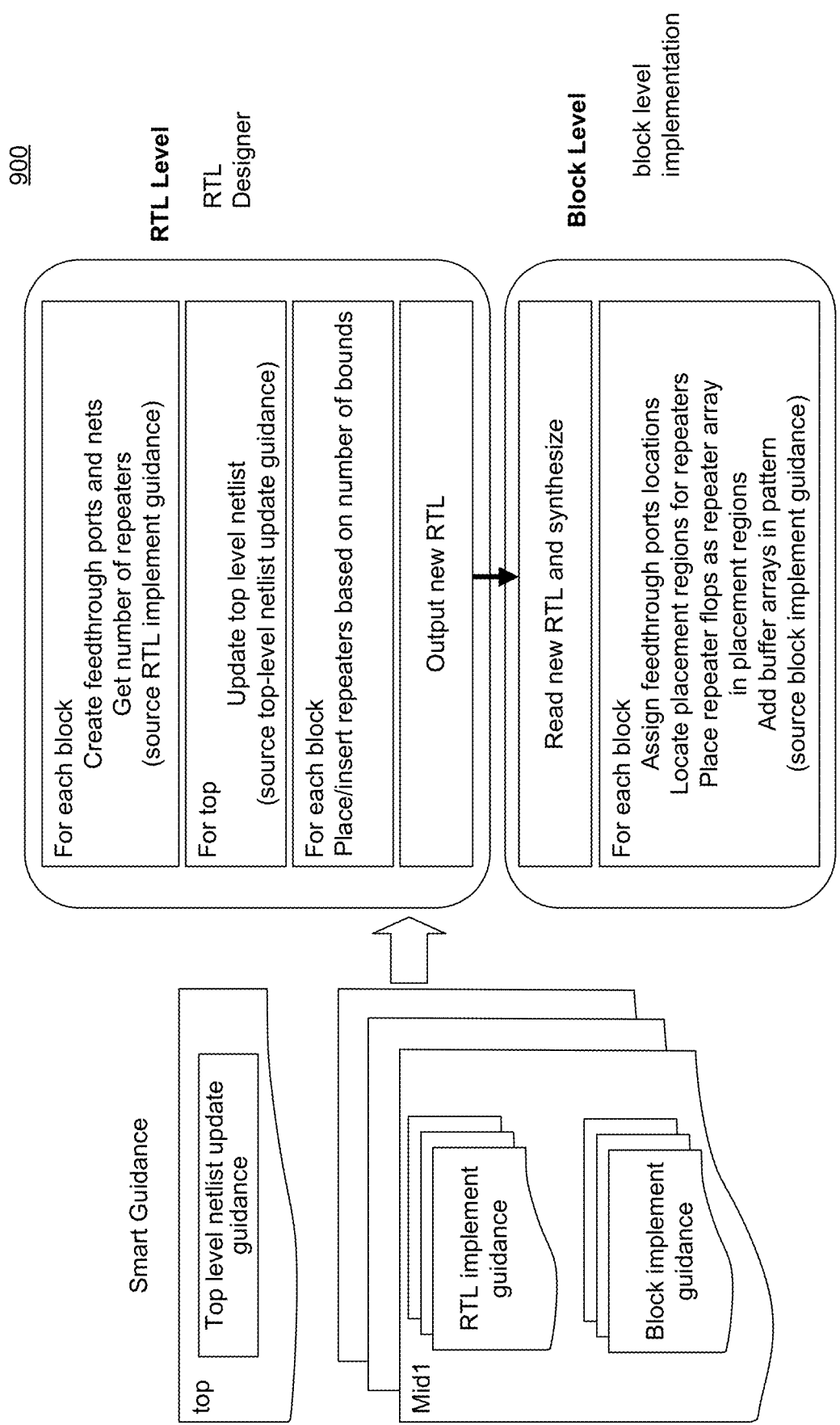
FIG. 9 illustrates smart guidance usage flow with retimer flops, in accordance with some embodiments.
Figure 10:
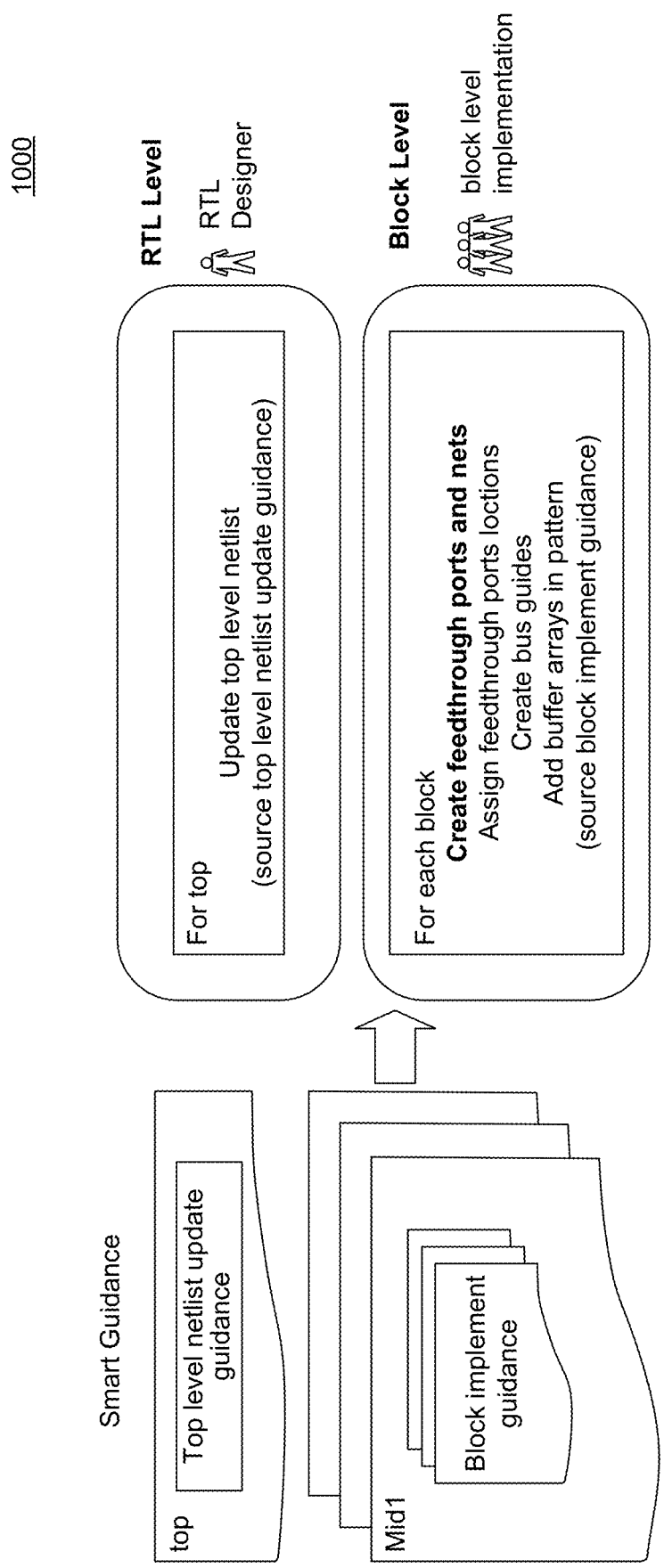
FIG. 10 illustrates smart guidance usage flow without retimer flops, in accordance with some embodiments.

FIG. 9 illustrates an overview of smart guidance usage flow with retimer flops, in accordance with some embodiments. By way of non-limiting example, when generating smart guidance, RTL implement guidance may not be generated. The RTL designer may not need to insert retimer flops. Accordingly, block implementation guidance may not need to place retimer flops. However, feedthrough ports and bus guides creation may be written into block implement guidance directly, based on which RTL designer may update top-level netlist after all blocks are implemented. The smart guidance usage flow 900 represents the smart guidance usage flow with retimer flops, and accordingly, each block-level smart guidance includes RTL guidance at a block level. An overview of smart guidance usage flow without retimer flops is shown in FIG. 10, in accordance with some embodiments. As discussed above, the smart guidance usage flow 1000 does not perform RTL guidance at a block level.

The following description refers to Appendix A, submitted an appendix to this specification. Drawings within Appendix A are referenced with the letter 'A' prefixed to corresponding figure numbers. According to some embodiments, auto-deriving smart guidance may include the following operations:

Create feedthrough ports and nets based on intersection(s) between bus guide(s) and layout block(s). Record commands used to create these feedthrough ports/nets.

Some steps may be illustrated using example in FIG. A1 and FIG. A2. As a starting point for creating feedthrough ports and nets, FIG. A1 show a top level net n connecting B1/p1 and B3/p2. FIG. A2 shows the bus guide created for net n with intersection locations circled.

As shown in FIG. A3, feedthrough ports fp1, and fp2 are created based on the intersection locations. Feedthrough net fn connecting fp1 and fp2 also get created since the intersection locations indicating fp1 and fp2 needs to be connected.

The commands used to create the feedthrough ports and nets may be netlist editing commands existing in EDA place-and-route tools, for example. The commands recorded may be stored for generating smart guidance for implementation later.

Update top-level connection. Record the command(s) used.

FIG. A4 shows top-level connection having been updated by changing the connection n to connect B1/p1 and B2/fp1. A new net n2 is created to connect B2/fp2 and B3/p2.

With this change, the connection between B1/p1 and B3/p2 may be restructured into three connections: B1/p1-B2/fp1, fp1-fp2 (in block B2), and B2/fp1 and B3/p2, in this example.

Commands used to update top-level connections may include netlist-editing commands existing in EDA place-and-route tools, for example. The commands recorded may be stored for generating smart guidance for implementation later.

Create bus guide based on overlapping area between block and the bus guide, recording commands for bus-guide creation.

As shown in FIG. A5, bus guide fbg is created based on the overlapping area of top-level bus guide bg and B2 that are shown in FIG. A2. The bus guide fbg also associated with the net fn in the layout block B2.

Bus-guide creation commands may be similar to route-shape creation commands in EDA tools, but may instead apply to multiple nets as a group, for example.

Update top-level bus guide, recording commands for creating and editing bus guide.

Similar to top level connection, bus guide at top level also need to be updated. FIG. A6 shows two new bus guides bg2 and bg3 got created and original bus guide bg got removed. The bus guides bg2 and bg3 also associated with the net n and net n2, respectively.

Similar to top-level connection, the path of bus guide bg may then be restructured into three bus guides: bg2, fbg, and bg3, in this example.

Again, the bus-guide creation commands and/or editing commands may be similar to route-shape creation and/or editing commands in EDA tools, for example.

If there is no space between blocks (abutting blocks) as shown in FIGS. A7 and A8, the feedthrough ports, feedthrough nets, and bus guide will be created as shown in FIGS. A9 and A10. At the top level, netlist changes may be the same as those shown in FIG. A4. However, there may not be a bus guide at the top level, as shown in FIG. A11.

Clone annotated repeaters and derive commands for repeater related operations.

FIG. A12 shows the annotated repeaters are planned in the abutting example of FIG. A8. Similar to bus guide, new annotated repeaters, as shown in FIG. A13, will be created in block B2 based on the plan at top level.

For guidance creation, several operations (command sequences) may be derived and recorded. For RTL changes:

Function to return the number of retimer flop for feedthrough net(s).

Functions to return the naming convention of the retimer flops to be created(s).

Similar functions may apply for other corresponding repeaters, for example.

For block implementation:
Based on the location and potential area of annotated repeater with retimer flop type, define placement area for retimer flop placement location. Such operations may be performed using placement-constraint settings in EDA tools, for example.

Place retimer flops into array pattern. This functionality may be implemented via automated processing of smart-guidance commands or scripts, heuristics, neural networks, machine-learning processes or algorithms, or similar methods based at least in part on data and rules relating to repeaters (distance, size, number), bus width (number of nets, physical width), and/or other vectorized parameters for quantitative or qualitative constraints pertaining to input and/or output, for example.

Insert/place buffer arrays or other repeaters along the bus guide based on the locations and the information on the annotate repeaters with buffer array type. This functionality may be implemented via automated processing of smart-guidance commands or scripts, heuristics, neural networks, machine-learning processes or algorithms, or similar methods based at least in part on data and rules relating to repeaters (distance, size, number), bus width (number of nets, physical width), and/or other vectorized parameters for quantitative or qualitative constraints pertaining to input and/or output, for example. The annotated repeater(s) with buffer array type(s) may have the nets involved and the order of the nets such that buffers can be inserted on the nets involved and placed into array pattern.

The examples shown in these steps and figures of Appendix A show one net in a bus, in order to simplify the example depiction of an otherwise complex process. However, actual buses may have many nets (e.g., 128 nets for a 128-bit bus). And there may be multiple buses in a top-level design, none of which may overlap in a given layer of an integrated circuit (IC). Therefore, planning for a given IC layout is a complex and potentially time-consuming and resource-intensive process, but it is a process that may be streamlined by the novel enhanced techniques described herein, including auto-generating smart guidance based at least in part on annotated repeaters, shown by way of several examples in these drawings, specification, and appendix to the specification.

Generate smart guidance based on the recorded command and operations.

A next step of the smart guidance may generate implementation guidance as scripts or other automated operations. Guidance or guidance scripts may be stored, for multiple blocks or for each block, in a computer memory or data storage, e.g., filesystem, such as in a directory, database, or other data structure, with the corresponding names of corresponding layout blocks, so as to facilitate application of such guidance by other programs or designers.

The guidance scripts may contain the commands and operations recorded in the above steps as outlined in Appendix A. In the examples shown in the appendix, there may be two set of guidance scripts:

For RTL changes:
Script to update top level connection.
Scripts to create block level feedthrough ports, and feedthrough nets.
Script to return number of retimer flops for each feedthrough net in a block.
Script to return naming convention of the retimer flops to be added. RTL designer may add retimer flops to the feedthrough nets, following which, corresponding files or descriptions in compliance with a naming convention may be returned as a result.

For block implementation:
Scripts to assign port locations.
Scripts to create placement region and place retimer flop arrays.
Script to create bus guides.
Script to insert buffer array along the bus guides at the targeted locations.

Figure 11:
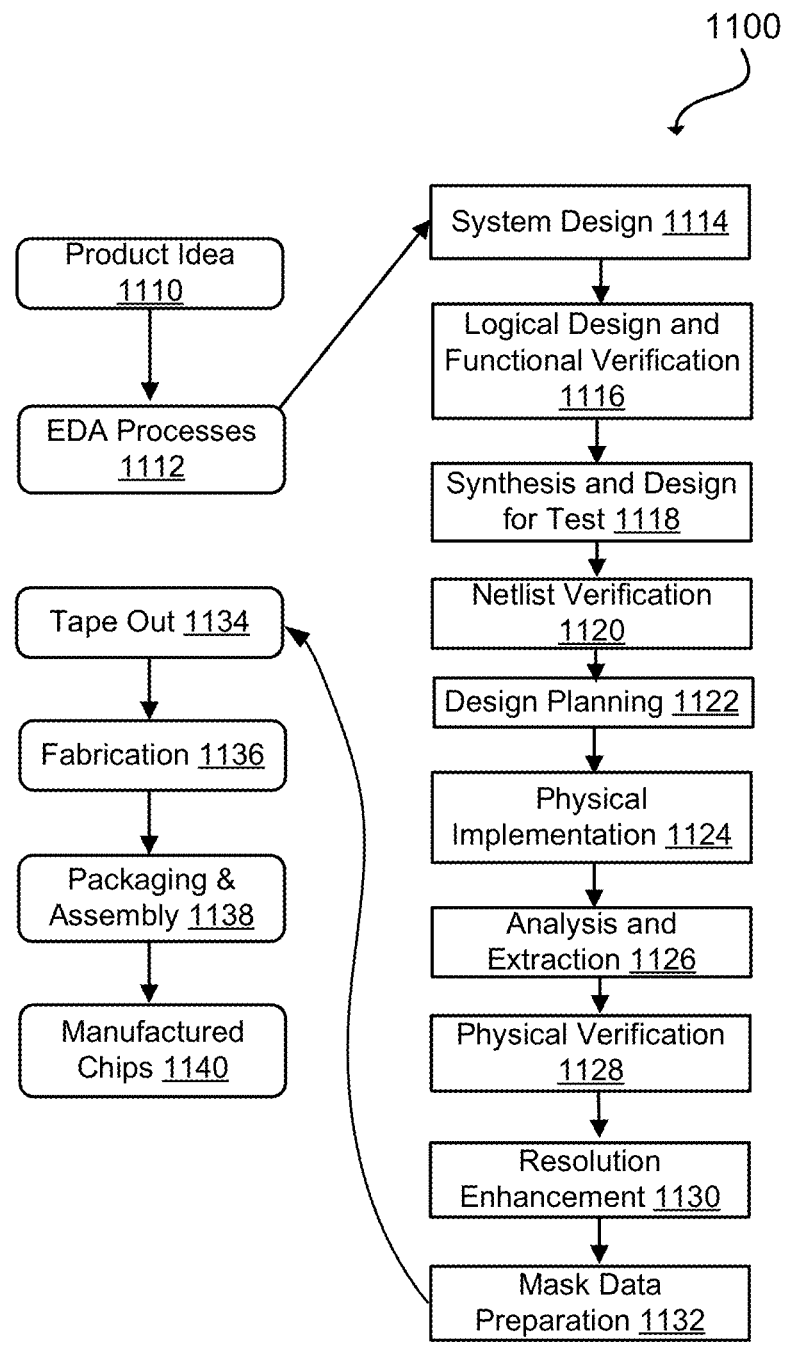
FIG. 11 illustrates a flowchart of various processes used during the design and fabrication of an integrated circuit, according to an exemplary aspect of the present disclosure.

FIG. 11 illustrates an example set of processes 1100 used during the design, verification, and fabrication of an article of manufacture, such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1110 with information supplied by a designer, information that is transformed to create an article of manufacture that uses a set of EDA processes 1112. When the design is finalized, the design is taped-out 1134, which is when artwork (e.g., geometric patterns) for the integrated circuit is sent to a fabrication facility to manufacture the mask set, which is then used to manufacture the integrated circuit. After tape-out, a semiconductor die is fabricated 1136, and packaging and assembly processes 1138 are performed to produce the finished integrated circuit 1140.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 11. The processes described by being enabled by EDA products (or tools).

During system design 1114, the functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During the logic design and functional verification 1116, modules or components in the circuit are specified in one or more description languages, and the specification is checked for functional accuracy. For example, the components of the circuit may be verified to generate outputs that match the requirements of the specification of the circuit or system being designed. Functional verification may use simulators and other programs such as test bench generators, static HDL checkers, and formal verifiers. In some embodiments, special systems of components referred to as 'emulators' or 'prototyping systems' are used to speed up the functional verification.

During synthesis and design for test 1118, HDL code is transformed into a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1120, the netlist is checked for compliance with timing constraints and for correspondence with the HDL code. During design planning 1122, an overall floor plan for the integrated circuit is constructed and analyzed for timing and top-level routing.

During layout or physical implementation 1124, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1126, the circuit function is verified at the layout level, which permits refinement of the layout design. During physical verification 1128, the layout design is checked to ensure that manufacturing constraints are correct, such as DRC constraints, electrical constraints, lithographic constraints, and that circuitry function matches the HDL design specification. During resolution enhancement 1130, the geometry of the layout is transformed to improve how the circuit design is manufactured.

During tape-out, data is created to be used (after lithographic enhancements are applied if appropriate) for the production of lithography masks. During mask data preparation 1132, the 'tape-out' data is used to produce lithography masks that are used to produce finished integrated circuits.

A storage subsystem of a computer system (such as computer system 1200 of FIG. 12, or host system 1207 of FIG. 12) may be used to store the programs and data structures that are used by some or all of the EDA products described herein, and products used for the development of cells for the library and for the physical and logical design that use the library.

Figure 12:
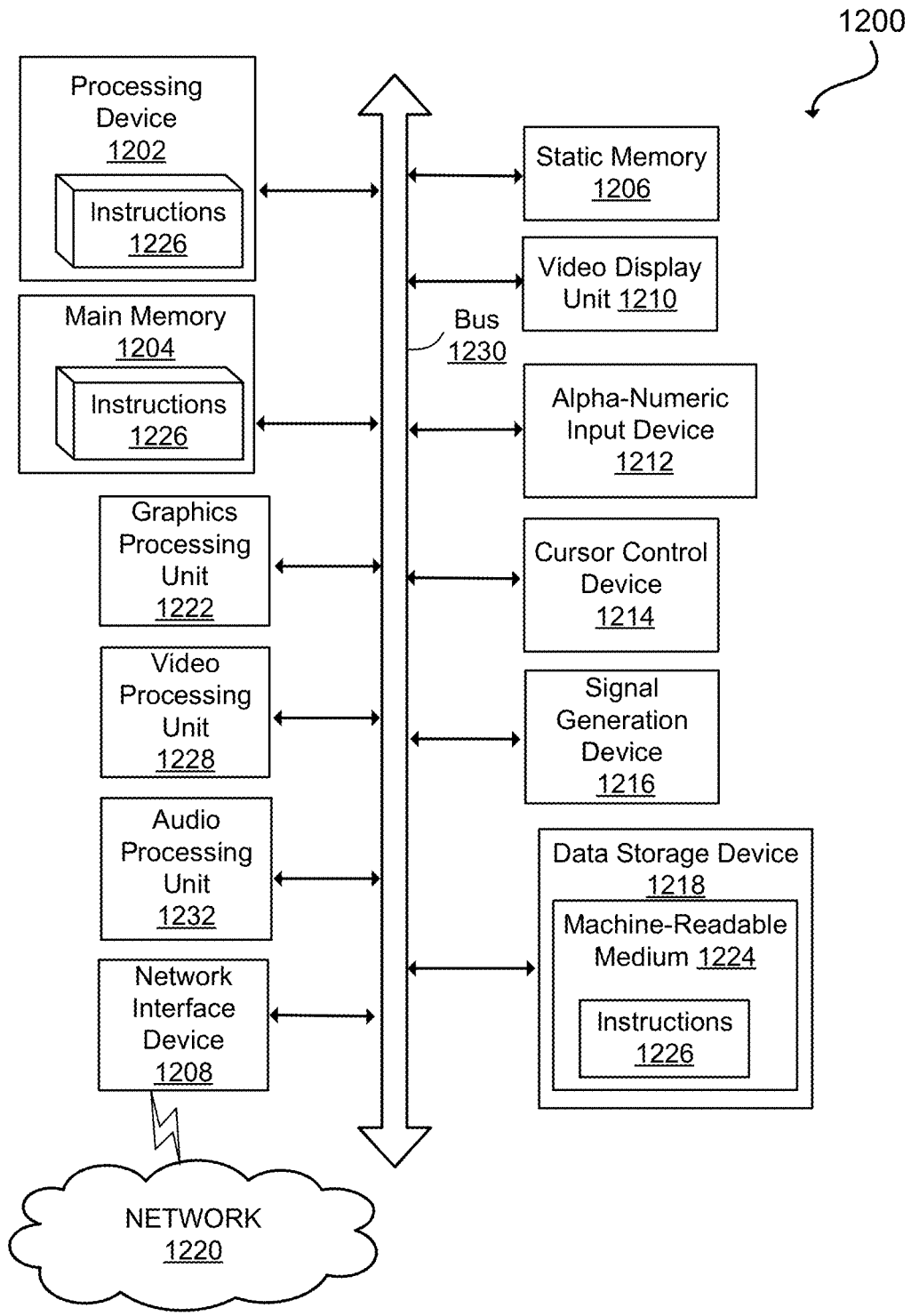
FIG. 12 illustrates a diagram of an example computer system in which aspects of the present disclosure may operate.

FIG. 12 illustrates an example machine of a computer system 1200 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in a client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1200 includes a processing device 1202, a main memory 1204 (e.g., read-only memory (ROM), flash memory, dynamic random access memory (DRAM) such as synchronous DRAM (SDRAM), a static memory 1206 (e.g., flash memory, static random access memory (SRAM), etc.), and a data storage device 1218, which communicate with each other via a bus 1230.

The processing device 1202 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 1202 may also be one or more special-purpose processing devices such as an application-specific integrated circuit (ASIC), a field-programmable gate array (FPGA), a digital signal processor (DSP), network processor, or the like. The processing device 1202 may be configured to execute instructions 1226 for performing the operations and steps described herein.

The computer system 1200 may further include a network interface device 1208 to communicate over the network 1220. The computer system 1200 also may include a video display unit 1210 (e.g., a liquid crystal display (LCD) or a cathode ray tube (CRT)), an alphanumeric input device 1212 (e.g., a keyboard), a cursor control device 1214 (e.g., a mouse), a graphics processing unit 1222, a signal generation device 1216 (e.g., a speaker), graphics processing unit 1222, video processing unit 1228, and audio processing unit 1232.

The data storage device 1218 may include a machine-readable storage medium 1224 (also known as a non-transitory computer-readable medium) on which is stored one or more sets of instructions 1226 or software embodying any one or more of the methodologies or functions described herein. The instructions 1226 may also reside, completely or at least partially, within the main memory 1204 and/or within the processing device 1202 during execution thereof by the computer system 1200, the main memory 1204, and the processing device 1202 also constituting machine-readable storage media.

In some implementations, the instructions 1226 include instructions to implement functionality corresponding to the present disclosure. While the machine-readable storage medium 1224 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1202 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to convey the substance of their work to others skilled in the art most effectively. An algorithm may be a sequence of operations leading to the desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer-readable storage medium, such as but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure, as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as read-only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures, and like elements are labeled with like numerals. The disclosure and drawings are, accordingly, to be regarded in an illustrative sense rather than a restrictive sense.

What is claimed is:

1. A computer-implemented method for placing and routing, the method comprising:
   creating a first bus guide of a plurality of bus guides and a second bus guide of the plurality of bus guides for an integrated circuit, wherein the first bus guide corresponds to a first plurality of bit nets, and wherein the second bus guide corresponds to a second plurality of bit nets;
   routing the first bus guide and the second bus guide through a plurality of layout blocks of the integrated circuit;
   annotating the first bus guide or the second bus guide to identify a plurality of areas for placing a plurality of repeaters within the first bus guide or the second bus guide;
   based on annotations of the first bus guide or the second bus guide, generating, by at least one processor, a plurality of guidance directories corresponding to a plurality of routes through the plurality of layout blocks, wherein each guidance directory of the plurality of guidance directories is associated with a layout block of the plurality of layout blocks;
   deriving, by the at least one processor, instructions for placing the plurality of repeaters within the first bus guide or the second bus guide based on the plurality of guidance directories; and
   placing the plurality of repeaters at the plurality of layout blocks on the identified plurality of areas on the first bus guide or the second bus guide according to the instructions based on the plurality of guidance directories.

2. The computer-implemented method of claim 1, further comprising:
   creating, on the first bus guide or the second bus guide, a plurality of pin areas for connecting a plurality of inputs or outputs corresponding to the first plurality of bit nets or the second plurality of bit nets.

3. The computer-implemented method of claim 1, wherein annotating the first bus guide or the second bus guide further comprises:
   annotating the plurality of repeaters based on at least one of a repeater function, or a repeater type of a repeater of the plurality of repeaters.

4. The computer-implemented method of claim 1, wherein annotating the first bus guide or the second bus guide further comprises:
   adding a buffer array to the first bus guide or the second bus guide.

5. The computer-implemented method of claim 1, wherein the first bus guide and the second bus guide are in different layers of the integrated circuit, and wherein the first bus guide and the second bus guide are not overlapping.

6. The computer-implemented method of claim 1, wherein the plurality of layout blocks are abutted in at least one of a single layer of the integrated circuit, or different layers of the integrated circuit.

7. The computer-implemented method of claim 1, wherein creating the first bus guide and the second bus guide further comprises:
creating the first bus guide of a first width; and
creating the second bus guide of a second width, wherein the first width is different from the second width.

8. The computer-implemented method of claim 1, wherein creating the first bus guide and the second bus guide further comprises:
selecting a width of each of the first bus guide and the second bus guide, based at least in part on a size of at least one repeater of the plurality of repeaters to be placed on the first bus guide or the second bus guide.

9. The computer-implemented method of claim 1, wherein generating the plurality of guidance directories further comprises:
generating one or more scripts executable by the at least one processor.

10. A system for placing and routing comprising:
a memory configured to store operations; and
one or more processors configured to perform the operations, the operations comprising:
creating a first bus guide of a plurality of bus guides and a second bus guide of the plurality of bus guides for an integrated circuit, wherein the first bus guide corresponds to a first plurality of bit nets, and wherein the second bus guide corresponds to a second plurality of bit nets,
routing the first bus guide and the second bus guide through a plurality of layout blocks of the integrated circuit,
annotating the first bus guide or the second bus guide to identify a plurality of areas for placing a plurality of repeaters within the first bus guide or the second bus guide,
based on annotations of the first bus guide or the second bus guide, generating a plurality of guidance directories corresponding to a plurality of routes through the plurality of layout blocks, wherein each guidance directory of the plurality of guidance directories is associated with a layout block of the plurality of layout blocks,
deriving instructions for placing the plurality of repeaters within the first bus guide or the second bus guide based on the plurality of guidance directories, and
placing the plurality of repeaters at the plurality of layout blocks on the identified plurality of areas on the first bus guide or the second bus guide according to the instructions based on the plurality of guidance directories.

11. The system of claim 10, wherein the operations further comprise creating, on the first bus guide or the second bus guide, a plurality of pin areas for connecting a plurality of input or output corresponding to the first plurality of bit nets or the second plurality of bit nets.

12. The system of claim 10, wherein annotating the first bus guide and the second bus guide further comprises:
annotating the plurality of repeaters based on at least one of a repeater function, or a repeater type of a repeater of the plurality of repeaters.

13. The system of claim 10, wherein annotating the first bus guide and the second bus guide further comprises:
adding a buffer array to the first bus guide or the second bus guide.

14. The system of claim 10, wherein the first bus guide and the second bus guide are in different layers of the integrated circuit, and wherein the first bus guide and the second bus guide are not overlapping.

15. The system of claim 10, wherein the plurality of layout blocks are abutted in at least one of a single layer of the integrated circuit, or different layers of the integrated circuit.

16. The system of claim 10, wherein creating the first bus guide and the second bus guide, further comprises:
creating the first bus guide of a first width; and
creating the second bus guide of a second width, wherein the first width is different from the second width.

17. The system of claim 10, wherein creating the first bus guide and the second bus guide, further comprises:
selecting a width of each of the first bus guide and the second bus guide, based at least in part on a size of at least one repeater of the plurality of repeaters to be placed on the first bus guide or the second bus guide.

18. The system of claim 10, wherein generating the plurality of guidance directories further comprises:
generating one or more scripts executable by the one or more processors.

19. A non-transitory, tangible computer-readable device having instructions stored thereon that, when executed by at least one computing device, causes the at least one computing device to perform operations for placing and routing, the operations comprising:
creating a first bus guide of a plurality of bus guides and a second bus guide of the plurality of bus guides for an integrated circuit, wherein the first bus guide corresponds to a first plurality of bit nets, and wherein the second bus guide corresponds to a second plurality of bit nets;
routing the first bus guide and the second bus guide through a plurality of layout blocks of the integrated circuit;
annotating the first bus guide or the second bus guide to identify a plurality of areas for placing a plurality of repeaters within the first bus guide or the second bus guide;
based on annotations of the first bus guide or the second bus guide, generating a plurality of guidance directories corresponding to a plurality of routes through the plurality of layout blocks, wherein each guidance directory of the plurality of guidance directories is associated with a layout block of the plurality of layout blocks;
deriving instructions for placing the plurality of repeaters within the first bus guide or the second bus guide based on the plurality of guidance directories; and
placing the plurality of repeaters at the plurality of layout blocks on the identified plurality of areas on the first bus guide or the second bus guide according to the instructions based on the plurality of guidance directories.

20. The non-transitory, tangible computer-readable device of claim 19, wherein generating the guidance directory further comprises:
generating one or more scripts executable by the at least one computing device.

* * * * *